(12) United States Patent
Turnquist et al.

(10) Patent No.: US 6,567,941 B1
(45) Date of Patent: May 20, 2003

(54) EVENT BASED TEST SYSTEM STORING PIN CALIBRATION DATA IN NON-VOLATILE MEMORY

(75) Inventors: James Alan Turnquist, Santa Clara, CA (US); Rochit Rajsuman, Santa Clara, CA (US); Shigeru Sugamori, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/547,752

(22) Filed: Apr. 12, 2000

(51) Int. Cl.[7] .................... G01R 31/28; G01R 31/02; G01R 31/26; G06F 19/00; G11C 7/00

(52) U.S. Cl. .................... 714/724; 324/763; 324/765; 702/117; 365/201

(58) Field of Search .................. 714/718–725, 714/735–738, 724–731, 741, 37–39; 324/600–606, 754–765; 365/201; 702/108, 117, 120, 124–126

(56) References Cited

U.S. PATENT DOCUMENTS

| | | | | |
|---|---|---|---|---|
| 5,101,153 A | * | 3/1992 | Morong, III | 324/537 |
| 5,629,880 A | * | 5/1997 | Negishi | 702/85 |
| 5,838,694 A | * | 11/1998 | Illes et al. | 714/738 |
| 5,925,145 A | * | 7/1999 | Illes et al. | 714/738 |
| 6,078,187 A | * | 6/2000 | Hanners et al. | 324/761 |
| 6,479,983 B1 | * | 11/2002 | Ebiya | 324/158.1 |

* cited by examiner

Primary Examiner—Albert Decady
Assistant Examiner—Cynthia Britt
(74) Attorney, Agent, or Firm—Muramatsu & Associates

(57) ABSTRACT

An event based test system has a cost effective, error free, secure and simple way of managing the calibration data for all of the pin cards used therein. The test system has a large number of test channels for testing a semiconductor device under test (DUT) by applying test patterns to device pins of the DUT through the test channels and examining response outputs of the DUT. The test system includes a plurality of pin cards, each having a plurality of pin units therein to establish a part of the test channels, a non-volatile memory provided within each pin card for storing calibration data for compensating error factors involved in the pin units mounted in the corresponding pin card, and a microprocessor provided within each pin card for managing the calibration data and executing the calibration procedure for all of the pin units in the corresponding pin card, and wherein each pin unit is configured as an event tester in which a test, pattern or a strobe signal is directly generated based on event data stored in an event memory which define any changes from a previous event with reference to a time difference therefrom.

7 Claims, 7 Drawing Sheets

Fig. 8

```
Calbiration_Data_Configure()
{
 struct PIN_UNIT {
        unsigned int corcv; /* correction offset to reference comparison voltage register */
        unsigned int cordv; /* correction offset to reference driving voltage register */
        } *pin_unit ;

struct CALIBRATION_MEMORY {
        /* calibration data for correction offset to reference comparison voltage */
        unsigned int corcv;
        /* calibration data for correction offset to reference driving voltage */
        unsigned int cordv;
        } *calibration_memory;

/* Base address of calibration memory data */
#define CALIBRATION_MEMORY_BASE   ((struct CALIBRATION_MEMORY *) 0x100)

/* Base address of pin units calibration registers */
#define PIN_UNIT_BASE    ((struct PIN_UNIT *) 0x200)

int unit_count ;

pin_unit = PIN_UNIT_BASE ;

calibration_memory = CALIBRATION_MEMORY_BASE;

for(unit_count =0 ; unit_count <8; unit_count ++)
        {
                pin_unit [unit_count] .corcv = calibration_memory [unit_count].corcv ;
                pin_unit [unit_count] .cordv = calibration_memory [unit_count].cordv ;
        }
}
```

EVENT BASED TEST SYSTEM STORING PIN CALIBRATION DATA IN NON-VOLATILE MEMORY

FIELD OF THE INVENTION

This invention relates to a semiconductor test system for testing semiconductor devices such as ICs, and more particularly, to an event based semiconductor test system which stores calibration data concerning various parameters affecting test accuracy with respect to each pin unit in a non-volatile memory within the pin card.

BACKGROUND OF THE INVENTION

In testing semiconductor devices such as ICs and LSIs by a semiconductor test system, such as an IC tester, a semiconductor IC device to be tested is provided with test signals or test patterns produced by an IC tester at its appropriate tester pins at predetermined test timings. The IC tester receives output signals from the IC device under test in response to the test signals. The output signals are strobed or sampled by strobe signals at predetermined timings to be compared with expected output data to determine whether the IC device functions correctly.

The test signals are transmitted to the device under test through drivers which establish intended amplitude, impedance and slew rate of the test signals. The output response signals from the device under test are sampled by analog comparators by the timings of the strobe signals to be compared with predetermined threshold voltages. Both the drivers and analog comparators are typically assembled in a block called a pin electronics. Since the pin electronics involves analog values of the test signals and response signals as well as DC voltages and currents for DC parametric measurement, parameters in the pin electronics need to be calibrated to insure accurate measurement. This invention is directed to storage of such calibration data in the semiconductor test system.

Traditionally, timings of the test signals and strobe signals are defined relative to a tester rate or a tester cycle of the semiconductor test system. Such a test system is sometimes called a cycle based test system. Another type of test system is called an event based test system wherein the desired test signals and strobe signals are produced by event data from an event memory directly on a per pin basis. The present invention is better suited to such an event based semiconductor test system, although the present invention is also applicable to the traditional cycle based semiconductor test system having a per-pin architecture.

In an event based test system, notion of events are employed, which are any changes of the logic state in signals to be used for testing a semiconductor device under test. For example, such changes are rising and falling edges of test signals or timing edges of strobe signals. The timings of the events are defined with respect to a time length from a reference time point. Typically, such a reference time point is a timing of the previous event. Alternatively, such a reference time point is a fixed start time common to all of the events.

In an event based test system, since the timing data in a timing memory (event memory) does not need to include complicated information regarding waveform, vector, delay and etc. at each and every test cycle, the description of the timing data can be dramatically simplified. In the event based test system, as noted above, typically, the timing (event) data for each event stored in an event memory is expressed by a time difference between the current event and the last event. Typically, such a time difference between the adjacent events (delta time) is small, unlike a time difference from a fixed start point (absolute time), a size of the data in the memory can also be small, resulting in the reduction of the memory capacity.

As noted above, the pin electronics circuits in the semiconductor test system need the calibration for achieving accurate measurement of the device parameters. An example of types of calibration data that may be needed in a semiconductor test system includes (1) compensation of reference driving voltage, (2) compensation of reference comparison (threshold) voltage, (3) compensation of driving current load, (4) compensation of parametric (DC voltage and current) measurement circuits connected to the test pin, (5) compensation of timing strobes used to trigger comparisons, and (6) compensation of timing triggers used to drive test pin stimulus (test signals). There are other error factors which also affect accuracy and resolution of the test result. Such other error factors include signal propagation delay times in a performance board and a pin fixture provided between the pin cards and the device under test.

Therefore, there is a need to establish an effective way to maintain calibration data in the test system so that the compensation of various parameters can be conducted at a certain time interval or at each power up.

SUMMARY OF THE INVENTION

Therefore, it is an object of the present invention to provide a semiconductor test system having a plurality of pin cards in which calibration data is stored in a pin card where each pin card includes a plurality of pin units where each pin unit is configured as an event based tester.

It is another object of the present invention to provide a semiconductor test system wherein each pin card having a plurality of pin units therein includes a non-volatile memory to store the calibration data of various parameters involved in the pin units in the pin card.

It is a further object of the present invention to provide an event based semiconductor test system wherein each pin card having a plurality of pin units therein includes a non-volatile memory for storing the calibration data of various parameters involved in the pin units and a processor for conducting a calibration process of the pin card.

It is a further object of the present invention to provide an event based semiconductor test system which has a cost effective, error free, secure and simple way of managing the calibration data for all of the pin cards used therein.

The present invention is a semiconductor test system for testing an electronics device under test (DUT) by producing events of various timings for supplying a test signal to the DUT and evaluating an output of the DUT at a timing of a strobe signal. The timings of the events can be freely changed by changing the timing data in an event memory.

In the present invention, the semiconductor test system is comprised of a large number of test channels for testing a semiconductor device under test (DUT) by applying test patterns to device pins of the DUT through the test channels and examining response outputs of the DUT. The test system is comprised of a plurality of pin cards each having a, plurality of pin units therein to establish a part of the test channels, a non-volatile memory provided within each pin card for storing calibration data for compensating error factors involved in the pin units mounted in the corresponding pin card, and a microprocessor provided within each pin card for managing the calibration data and executing the calibration procedure for all of the pin units in the corresponding pin card, where each pin unit is configured as an event tester in which a test pattern or a strobe signal is directly generated based on event data stored in an event memory which defines any changes from a previous event with reference to a time difference therefrom.

The calibration data includes data for compensating error factors regarding parameters used in the corresponding pin card in testing the DUT. For example, the calibration data includes data for compensating error factors including timings and reference voltages of the test patterns, timings of strobe signals and reference comparison voltages.

In a further aspect, the event based test system of the present invention further includes a performance board unique to the DUT for mounting the DUT thereon and having signal paths for transmitting signals to and from the DUT, and a pin fixture for interconnecting the plurality of pin cards in the test system with the performance board. In such a configuration, it is preferable that the calibration data includes data for compensating error factors including timings and reference voltages of test patterns, timings of strobe signals, reference comparison voltages, and signal propagation delays in the performance board and pin fixture.

According to the present invention, the semiconductor test system is configured to include a non-volatile memory storing calibration data in each pin card to compensate the error factors in all pin units in the pin card. Because the memory storing the calibration data is fixedly provided to the pin card, management of the calibration data by a manufacturer or a user of the test system is simplified such as in processes of inventory, pin card replacement, updating the calibration data, and etc. Since pin card includes a local microprocessor, a calibration process including data mapping for the pin units in the pin card is also simplified. According to the present invention, the event based test system is able to achieve an cost effective, error free, secure and simple way of managing the calibration data for all of the pin cards.

BRIEF DESCRIPTION OF THE DRAWINGS

FIG. 8 shows an example of program written in "C" programming language for initiating a calibration process at the time of power up in the test system.

DETAILED DESCRIPTION OF THE PREFERRED EMBODIMENT

Figure 1:
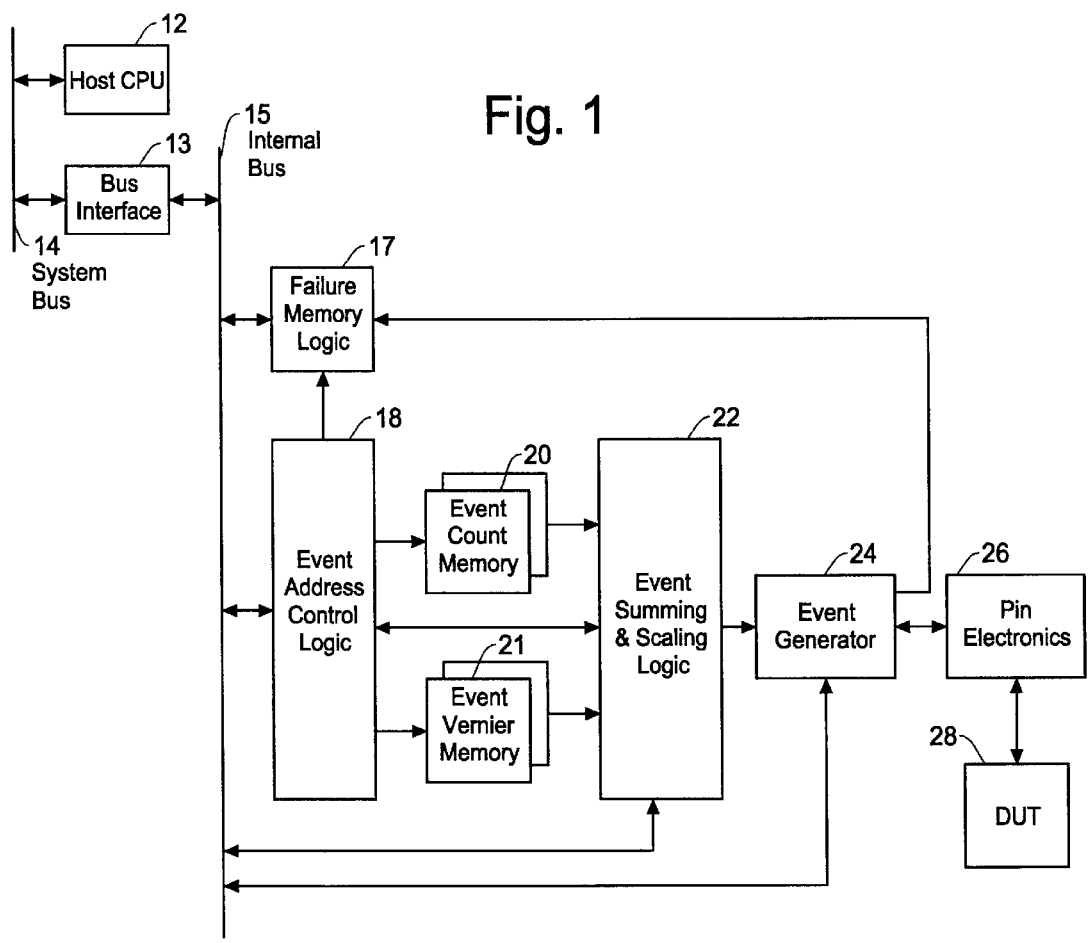
FIG. 1 is a schematic block diagram showing a basic structure of an event based test system of the present invention.

FIG. 1 is a schematic block diagram showing an example of basic structure in a semiconductor test system of the test system which is preferably an event based test system. The event based test system includes a host computer 12 and a bus interface 13 both are connected to a system bus (pin bus) 14, an internal bus 15, an address control logic 18, a failure memory 17, an event memory consists of an event count memory 20 and an event vernier memory 21, an event summing and scaling logic 22, an event generator 24, and a pin electronics (driver and comparator) 26. The event based test system is to evaluate a semiconductor device under test (DUT) 28, which is typically a memory IC such as a random access memory (RAM) and a flash memory or a logic IC such as a microprocessor and a digital signal processor, connected to the pin electronics 26.

An example of host computer 12 is a work station having a UNIX, Window NT, or Linux operating system therein. The host computer 12 functions as a user interface to enable a user to instruct the start and stop operation of the test, to load a test program and other test conditions, or to perform test result analysis in the host computer. The host computer 12 interfaces with a hardware test system through the system bus 14 and the bus interface 13. Although not shown, the host computer 12 is preferably connected to a communication network to send or receive test information from other test systems or computer networks.

The internal bus 15 is a bus in the hardware test system and is commonly connected to most of the functional blocks such as the address control logic 18, failure memory 17, event summing and scaling logic 22, and event generator 24. An example of address control logic 18 is a tester processor which is exclusive to the hardware test system and is not accessible by a user. The tester processor 18 provides instructions to other functional blocks in the test system based on the test program and conditions from the host computer 12. The failure memory 17 stores test results, such as failure information of the DUT 28, in the addresses defined by the address control logic 18. The information stored in the failure memory 17 is used in the failure analysis stage of the device under test.

The address control logic (address sequencer) 18 provides address data to the event count memory 20 and the event vernier memory 21. In an actual test system, plural sets of event count memory and event vernier memory will be provided, each set of which may correspond to a test pin of the test system. The event count and vernier memories store the timing data for each event of the test signals and strobe signals. The event count memory 20 stores the timing data which is an integer multiple of the reference clock (integral part), and the event vernier memory 21 stores timing data which is a fraction of the reference clock (fractional part). Within the context of the present invention, the timing data for each event is expressed by a time difference (delay time or delta time) from the previous event.

The event summing and scaling logic 22 is to produce data showing overall timing of each event based on the delta timing data from the event count memory 20 and event vernier memory 21. Basically, such overall timing data is produced by summing the integer multiple data and the fractional data. During the process of summing the timing data, a carry over operation of the fractional data (offset to the integer data) is also conducted in the timing count and offset logic 22. Further during the process of producing the overall timing, timing data may be modified by a scaling factor so that the overall timing be modified accordingly.

The event generator 24 is to actually generate the events based on the overall timing data from the event summing and scaling logic 22. The events (test signals and strobe signals) thus generated are provided to the DUT 28 through the pin electronics 26. Basically, the pin electronics 26 is formed of a large number of components, each of which includes a driver and a comparator as well as switches to establish input and output relationships with respect to the DUT 28.

Figure 2:
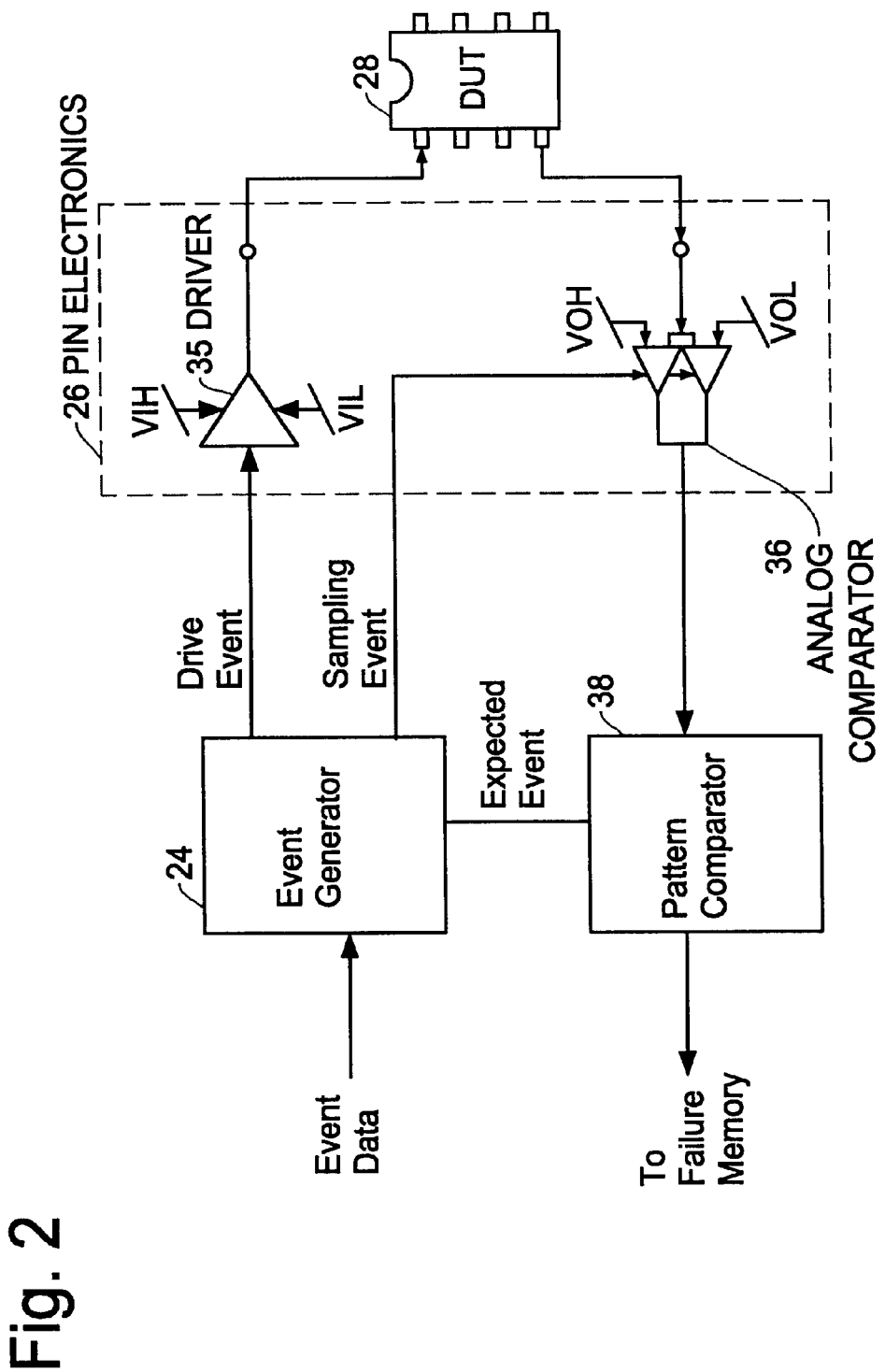
FIG. 2 is a block diagram showing a more detailed structure concerning the: pin electronics of FIG. 1 and associated drive events (test signal) and, sampling event (strobe signal) from the event generator.

FIG. 2 is a block diagram showing a more detailed structure in the pin electronics 26 having a driver 35 and an analog comparator 36. The event generator 24 produces drive events which are provided to an input pin of the DUT 28 as a test signal (test pattern) through the driver 35. The event generator 24 further produces a sampling event which is provided to the analog comparator 36 as a strobe signal for sampling an output signal of the DUT 28. The output signal of the analog comparator 36 is compared with the expected data from the event generator 24 by a pattern comparator 38. If there is a mismatch between the two, a failure signal is sent to the failure memory 17 in FIG. 1.

Although not shown, the pin electronics 26 also includes a circuitry for performing DC parametric test. The DC parametric test includes measurement of DC current flowing in a particular device pin while providing a reference DC voltage to the pin, or measurement of DC voltage at a particular device pin while supplying a reference DC current thereto. The pin electronics 26 may also include a circuit arrangement for changing source voltages to the device under test terminal resistors for device pins.

Because the pin electronics 26 involves various analog parameters noted above, and such parameters vary depending on the components used in the test system, physical positions and layouts in the test system, as well as time and environmental changes. Therefore, it is necessary to calibrate these parameters to ensure accurate test results on the semiconductor device under test.

An example of types of calibration data that may be needed in a semiconductor test system is reiterated here, i.e., (1) compensation of reference driving voltage, (2) compensation of reference comparison (threshold) voltage, (3) compensation of driving current load, (4) compensation of parametric (DC voltage and current) measurement circuits connected to the test pin, (5) compensation of timing strobes used to trigger comparisons, and (6) compensation of timing triggers used to drive test pin stimulus (test signals)

Figure 3:
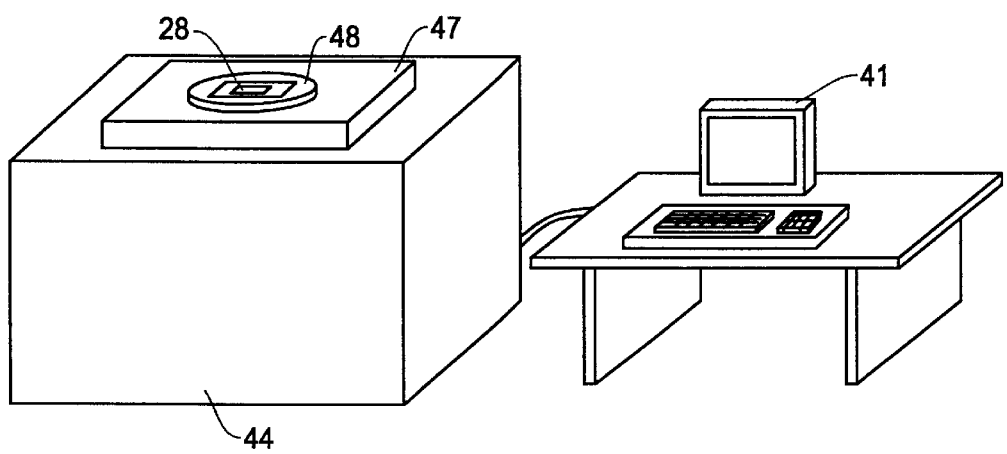
FIG. 3 is a schematic diagram showing an example of external appearance of an event based test system including a performance board and a pin fixture between the device under test and the pin cards.

It should also be noted that in the actual test system, the test signal is supplied to the device under test through a performance board and a pin fixture (performance board adapter). FIG. 3 is a schematic diagram showing an example of external appearance of an event based test system including a performance board and a pin fixture between the device under test and the pin electronics (mounted on a pin card). Signal propagation delays involved in the performance board and pin fixture also affect the test accuracy and resolution in the semiconductor device test.

In the example of FIG. 3, a semiconductor device under test (DUT) 28 is placed on a performance board 48 which is unique to a type of device to be tested. A plurality of pin cards are installed in a main frame 44. The performance board and the pin cards (not shown) are interfaced by a pin fixture (performance board adapter) 47. Typically, the pin fixture is a mechanical block having a large number of flexible contact pins such as pogo-pins to electrically connect the pin cards to the performance board 48.

As noted in the foregoing, the semiconductor test system must be calibrated as to various parameters for accurate measurement of the semiconductor device parameters. Calibration data is obtained by a manufacturer and stored in a storage device as factory calibration data. The calibration data may be modified or added by a user in the storage device as field calibration data. Based on the calibration data, errors involved in various parameters are compensated in a fixed time interval or at each power up.

Figure 4:
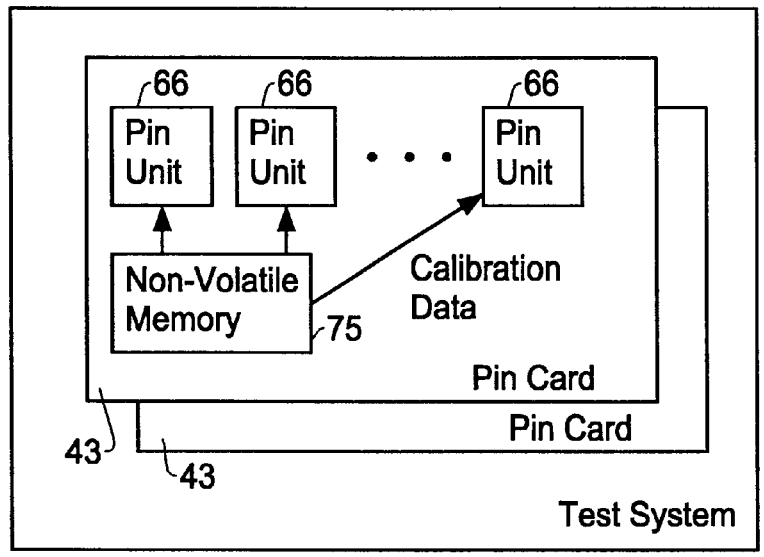
FIG. 4 is a schematic block diagram showing a basic concept of the present invention where the calibration data is stored in a non-volatile memory provided in each pin card in the test system.

FIG. 4 is a schematic diagram showing the basic concept of the present invention for storing the calibration data in the test system. In the present invention, each pin card. 43 includes a memory 75 to store the calibration data therein. The memory 75 is a non-volatile memory, such as a flash memory, so as to maintain the data when the source power is off. The non-volatile memory 75 stores all of the calibration data for the pin units 66 in the same pin card 43. Such a non-volatile memory can be in a various forms such as a stand-alone memory or a part of other storage device.

Figure 5:
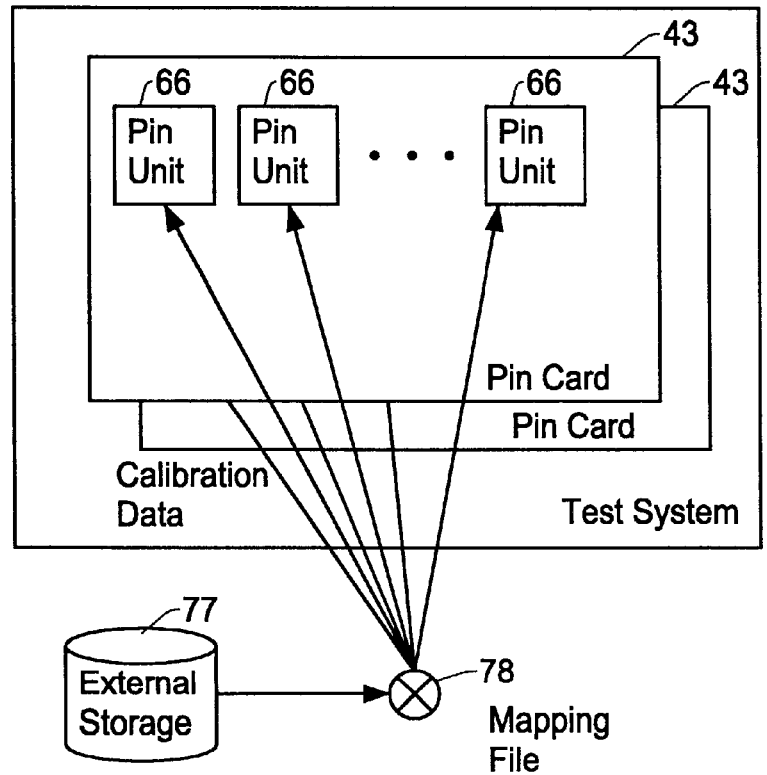
FIG. 5 is a schematic block diagram showing another approach for storing the calibration data in the test system where an external storage device provided separately from the pin cards stores the calibration data.

Before further going into details of the present invention of FIG. 4, the description is made here regarding the previous approach taken by the inventors. This example is shown in the block diagram of FIG. 5, wherein the calibration data for all of the pin cards, and thus all of the pin units of the test system, is stored in an external storage device 77. It should be noted that the example of FIG. 5 is an internal knowledge or trade secret of the assignee of this invention and examined by the inventors. The example of FIG. 5 is not publicly available and thus not prior art against the present invention.

The external storage device 77 saves factory and field calibration data regarding all of the pin units in the pin cards. The storage device 77 is, for example, a floppy disc or compact disc which is separated from the pin cards and is inserted in a host computer of a tester controller to read the calibration data therefrom. The calibration data for each pin unit is distributed by a mapping file 78 prepared in, for example, the host computer.

The inventors of this invention find that the structure of FIG. 5 having the external storage 77 separately from the pin cards in the test system is disadvantageous because of the following reasons:

The calibration items and calibration data must be tracked closely together in inventory of the pin cards, installation into a test system and system maintenance. The separation increases the overall manufacturing and maintenance cost. There is also an increase in the software because more complex system configuration software is needed to associate the external calibration data with its target pin cards Moreover, having the calibration data external to the pin cards has the following deficiencies:

(1) It requires the test system to locate and read the calibration data from the external, storage device and configure the pin card.

(2) If the external storage device is corrupted, calibration data for all pin cards may be lost, requiring an all new factory calibration of all pins in the test system, which can be a lengthy process requiring the transport and connection of special calibration equipment.

(3) When a pin card is moved to a new test system, the calibration data must be copied and mapped to the new system's card slot.

(4) Installing a new pin card on the test system requires the pin card calibration files accompanying the pin card and the updating of target test system's calibration mapping and data files.

(5) When several pin cards are removed from the test system for maintenance, care must be taken that they are placed exactly back in the same slots they originally came from.

Referring back to the present invention shown in FIG. 4, the calibration data is stored in the calibration memory 75 provided in each pin card 43. The calibration memory 75 is a non-volatile memory that can maintain the data when the power is turned off. Each pin card has a microprocessor that can read the calibration memory and write pin unit register (not shown). The advantages of present invention in storing the calibration data in a non-volatile memory in the target pin card are the following:

(1) With the card calibration information located on the pin board in a fixed location, it is easily configured into the hardware.

(2) Each board can carry with it their original factory calibration data with no: extra associated data files to install.

(3) Users would not be required to maintain any specific pin card slot mapping file information. This would be done automatically from the data stored in the non-volatile memory found on each card.

(4) Users would not be required to maintain any specific pin card calibration file information. This would be done automatically from the data stored in the non-volatile memory found on each card.

(5) The test system reliability will be improved because less information needs to be maintained externally to the system and the calibration data is now tightly coupled directly to its associated pin card.

(6) The test system can easily update the nonvolatile memory with new calibration data to compensate for component value changes over time.

(7) A calibration storage system efficiently stores the calibration data locally on the test system pin card that is to be compensated.

(8) A non-volatile memory system store the calibration data that is addressable by a processor to be used in the measurement and stimulus generation for device under test.

Figure 6:
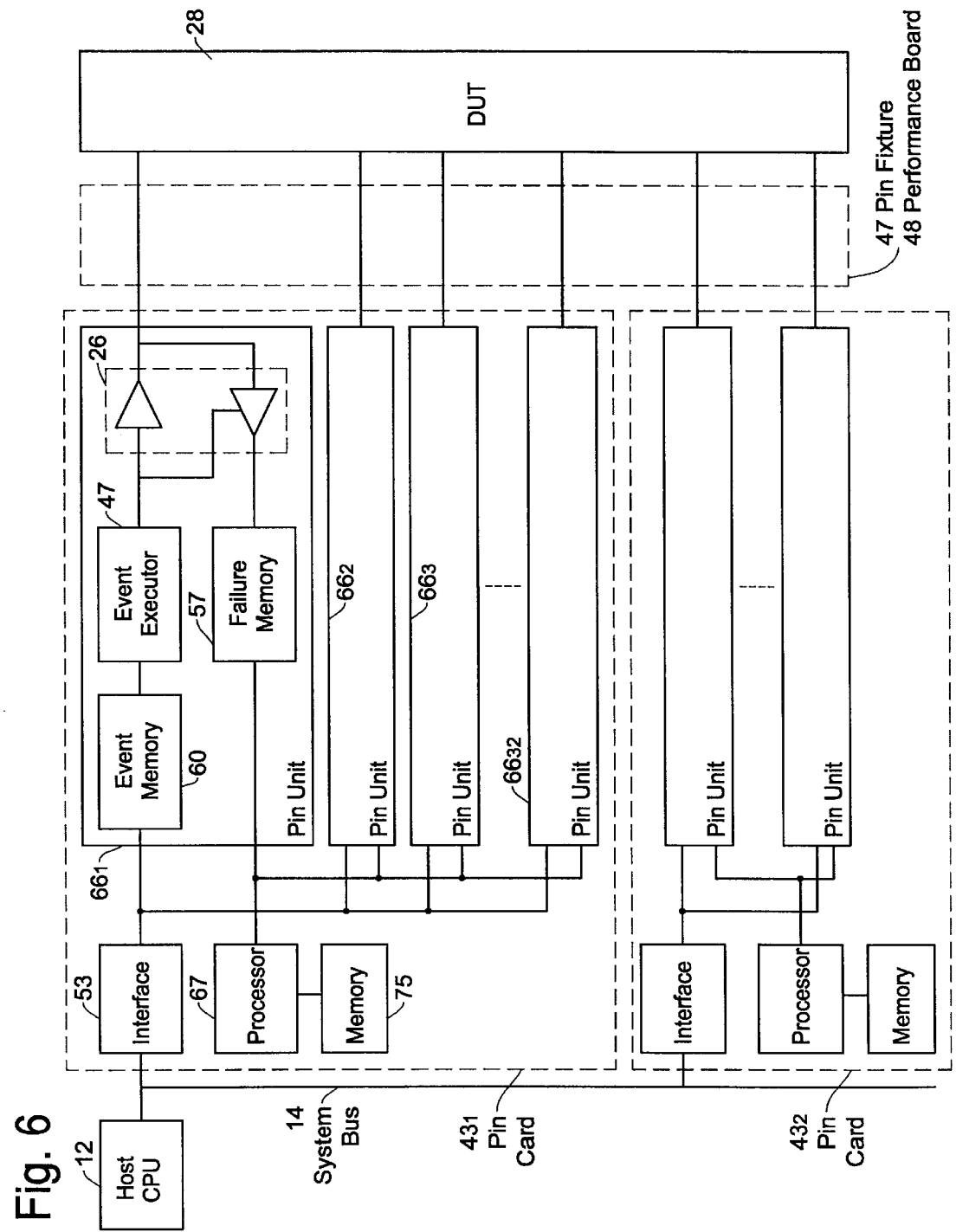
FIG. 6 is a block diagram showing an example of structure in the event based test system having a plurality of pin cards where each pin card includes a plurality of pin units or event testers.

FIG. 6 is a block diagram showing a basic structure of the event based semiconductor test system of the present invention. The test system includes a plurality of pin cards 43. Further, each pin card includes a plurality of pin units (event testers) 66 corresponding to a plurality of tester pins, such as 32 pin units for 32 tester pins. In the test system of FIG. 6, the plurality of event pin cards 43 are controlled by a tester controller, which is a host computer of the test system, through a system bus (pin bus) 14.

In FIG. 6, the pin cards 43 apply test patterns (test signals) to the device under test 28, and examines response output signals from the device under test resultant from the test patterns. Between the pin cards 43 and the device under test 28, the test system includes the pin fixture 47 and thee performance board 48, as shown in FIG. 3 as above. Each pin card 43 includes pin units $66_1$–$66_{32}$ for 32 tester pins, for example, an interface 53, a processor 67 and a memory 75. Each pin unit 66 corresponds to each tester pin in the event based test system, and has the same inner structure within the same tester board. In this example, the pin unit 66 includes an event memory 60, an event execution unit (event summing, scaling and event generation) 47, a pin electronics (driver and comparator) 26 and a test result (failure) memory 57. The memory 75 stores the calibration data as noted above as well as other data.

The event memory 60 stores event data for producing a test pattern. The event execution unit 47 produces the test pattern based on the event data from the event memory 60. The test pattern is supplied to the device under test through the pin electronics 26. An output signal of the device under test is compared with an expected signal by the comparator in the pin electronics 26, the result of which is stored in the test result memory 57.

As shown by the dotted line in FIG. 6, the device under test 28 and the pin electronics 26 are interfaced by the pin fixture 48 and the performance board 48. The test signals from the pin electronics (drivers) 26 to the device under test 28 may be affected by the signal propagation delay time in the pin fixture and the performance board. Similarly, the output signal from the device under test 28 to the pin electronics 26 (comparator) may be affected by the signal propagation delay time in the pin fixture and the performance board.

Figure 7:
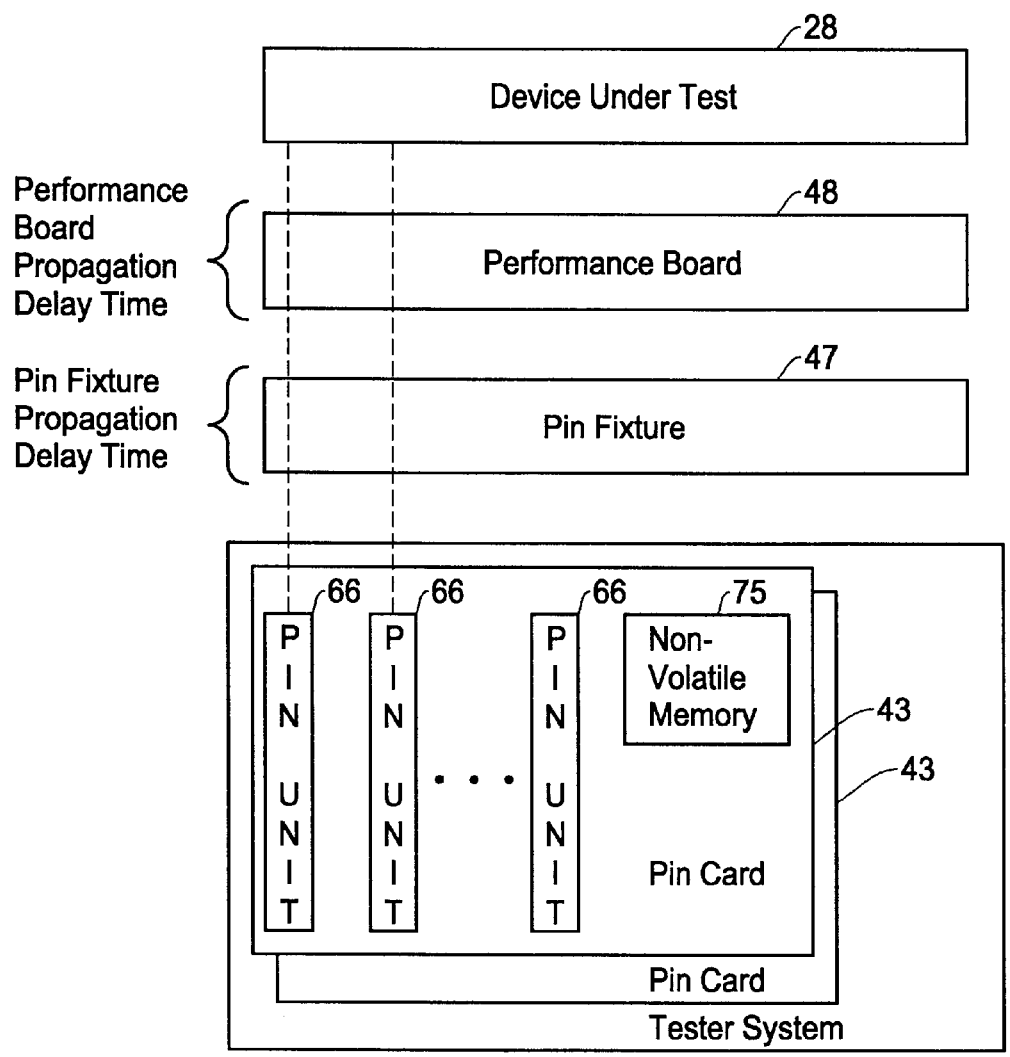
FIG. 7 is a schematic block diagram showing an example of concept in another embodiment of the present invention where the calibration data includes data for compensating propagation delay times involved in a performance board and a pin fixture.

Therefore, FIG. 7 is a schematic block diagram showing another embodiment of the present invention where the calibration data includes data for compensating propagation delay times in the performance board and pin fixture. Although, the information concerning the propagation delay time in the pin fixture 47 and the performance board 48 is not directly related to the pin card 43 but is related to the pin unit total signal path length. Thus, it is useful to store calibration data concerning (1) specific performance board propagation delay time calibration data, and (2) pin card to pin fixture propagation delay time calibration data in the non-volatile memory 75 in the pin card 43.

FIG. 8 shows an example of program written in "C" programming language for initiating a calibration process at the time of power up in the test system. In this "C" language example, the non-volatile memory is addressed by the name of "CALIBRATION_MEMORY" and the pin units are addressed by the name of "PIN_UNIT". When the power is applied to the test system, the embedded processor in the pin card executes the power up functions to initialize itself and starts the calibration process. The description in FIG. 8 is merely an example and many other ways of conducting the calibration are possible within the concept of the present invention.

According to the present invention, the semiconductor test system is configured to include a non-volatile memory storing calibration data in each pin card to compensate the error factors in all pin units in the pin card. Because the memory storing the calibration data is fixedly provided to the pin card, management of the calibration data by a manufacturer and a user is simplified such as in an inventory process, pin card replacement, updating the calibration data, and etc. Since pin card includes a local microprocessor, a calibration process including data mapping for the pin units in the pin card is also simplified. According to the present invention, the event based test system is able to achieve an cost effective, error free, secure and simple way of managing the calibration data for all of the pin cards.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A semiconductor test system for testing a semiconductor device under test (DUT) having a large number of test channels by applying test patterns to device pins of the DUT through the test channels and examining response outputs of the DUT, comprising:

a plurality of pin cards, each having a plurality of pin units therein to establish a part of the test channels;

a non-volatile memory provided within each pin card for storing calibration data for compensating error factors involved in the pin units mounted in the corresponding pin card; and a microprocessor provided within each pin card for managing the calibration data and executing the calibration procedure for all of the pin units in the corresponding pin card; and wherein each pin unit is configured as an event tester in which a test pattern or a strobe signal is directly generated based on event data stored in an event memory which define any changes from a previous event with reference to a time difference therefrom.

2. A semiconductor test system as defined in claim 1, wherein the calibration data includes data for compensating error factors regarding parameters used in the corresponding pin card in testing the DUT.

3. A semiconductor test system as defined in claim 1, wherein the calibration data includes data for compensating error factors including timings and reference voltages of test patterns, timings of strobe signals and reference comparison voltages.

4. A semiconductor test system as defined in claim 1, further comprising:

a performance board unique to the DUT for mounting the DUT thereon and having signal paths for transmitting signals to and from the DUT; and a pin fixture provided between the performance board and the main frame of the test system for interconnecting the plurality of pin cards in the test system with the performance board.

5. A semiconductor test system as defined in claim 4, wherein the calibration data includes data for compensating error factors including timings and reference voltages of test patterns, timings of strobe signals, reference comparison voltages, and signal propagation delays in the performance board and pin fixture.

6. A semiconductor test system as defined in claim 1, wherein each of the pin unit, comprising:

an event memory for storing timing of each event wherein the timing data of a current event is expressed by a delay time from an event immediately prior thereto with use of a specified number of data bits; and an address sequencer for generating address data and providing the address data to the event memory;

means for producing a test pattern based on the timing data from thee event memory; and a driver/comparator for transferring the test pattern to a corresponding pin of the DUT and receiving a response output signal from the DUT.

7. A semiconductor test system as defined in claim 6, wherein the timing data in the event memory is comprised of event count data which is formed with an integer multiple of a reference clock period (integral part data) and event vernier data which is formed with a fraction of the reference clock period (fractional part data).

* * * * *